(12) United States Patent
Park et al.

(10) Patent No.: US 11,482,670 B2
(45) Date of Patent: Oct. 25, 2022

(54) METHOD OF FABRICATING A VARIABLE RESISTANCE MEMORY DEVICE

(71) Applicant: SAMSUNG ELECTRONICS CO., LTD., Suwon-si (KR)

(72) Inventors: Jiho Park, Suwon-si (KR); Kwangmin Park, Seoul (KR); Jeonghee Park, Hwaseong-si (KR); Changyup Park, Hwaseong-si (KR); Sukhwan Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 150 days.

(21) Appl. No.: 16/909,218

(22) Filed: Jun. 23, 2020

(65) Prior Publication Data
US 2021/0104669 A1   Apr. 8, 2021

(30) Foreign Application Priority Data

Oct. 4, 2019  (KR) .................. 10-2019-0123107

(51) Int. Cl.
*H01L 45/00* (2006.01)
(52) U.S. Cl.
CPC .......... *H01L 45/1641* (2013.01); *H01L 45/06* (2013.01); *H01L 45/126* (2013.01); *H01L 45/143* (2013.01); *H01L 45/144* (2013.01)
(58) Field of Classification Search
CPC .............................. H01L 45/1641; H01L 45/06
See application file for complete search history.

(56) References Cited

U.S. PATENT DOCUMENTS

| 7,498,064 | B2 | 3/2009 | Horii |
| 8,557,627 | B2 | 10/2013 | Oh et al. |
| 8,680,501 | B2 | 3/2014 | Schrott et al. |
| 8,865,558 | B2 | 10/2014 | Park et al. |
| 9,425,395 | B2 | 8/2016 | Ahn |
| 9,460,931 | B2 | 10/2016 | Pachamuthu et al. |
| 2006/0024429 | A1* | 2/2006 | Horii ................. H01L 21/76816 257/E45.002 |
| 2012/0068136 | A1* | 3/2012 | Park .................... H01L 45/1683 257/1 |
| 2015/0325787 | A1* | 11/2015 | Ahn ...................... H01L 45/141 438/382 |
| 2019/0229252 | A1* | 7/2019 | Leblanc ............... C04B 35/645 |

FOREIGN PATENT DOCUMENTS

| JP | 2013-055258 | 3/2013 |
| KR | 10-1264533 | 5/2013 |
| KR | 10-1794209 | 11/2017 |

* cited by examiner

*Primary Examiner* — Moazzam Hossain
*Assistant Examiner* — Hajar Kolahdouzan
(74) *Attorney, Agent, or Firm* — F. Chau & Associates, LLC

(57) ABSTRACT

A method of fabricating a variable resistance memory device includes: forming a bottom electrode on a substrate; forming a dielectric layer on the substrate, wherein the dielectric layer has a first trench that exposes the bottom electrode; forming a variable resistance layer in the first trench; and irradiating the variable resistance layer with a laser, wherein the variable resistance layer is irradiated by the laser for a time of about 1.8 µs to about 54 µs.

21 Claims, 15 Drawing Sheets

METHOD OF FABRICATING A VARIABLE RESISTANCE MEMORY DEVICE

CROSS-REFERENCE TO RELATED APPLICATION

This U.S. nonprovisional application claims priority under 35 U.S.C. § 119 to Korean Patent Application No. 10-2019-0123107 filed on Oct. 4, 2019, in the Korean Intellectual Property Office, the disclosure of which is incorporated by reference herein in its entirety.

TECHNICAL FIELD

The present inventive concept relates to a method of fabricating a semiconductor device, and more particularly, to a method of fabricating a variable resistance memory device.

DISCUSSION OF THE RELATED ART

Generally, semiconductor devices can be classified into memory devices and logic devices. Memory devices store data. In general, semiconductor memory devices can be broadly classified into volatile memory devices and nonvolatile memory devices. The volatile memory devices, such as dynamic random access memory (DRAM) and static random access memory (SRAM), lose stored data when their power supply is interrupted. The nonvolatile memory devices, such as programmable read only memory (PROM), erasable PROM (EPROM), electrically erasable ROM (EEPROM), and flash memory devices, do not lose stored data even when their power supply is interrupted.

Other semiconductor memory devices, for example, ferroelectric random access memory (FRAM), magnetic random access memory (MRAM), and phase change random access memory (PRAM), are currently under development to provide semiconductor memory devices that have high performance and low power consumption. These semiconductor memory devices include a material having characteristics in which their resistance becomes different depending on applied electric current or voltage and their resistance is maintained even when the applied electric current or voltage supply is interrupted.

SUMMARY

According to an exemplary embodiment of the present inventive concept, a method of fabricating a variable resistance memory device, the method including: forming a bottom electrode on a substrate; forming a dielectric layer on the substrate, wherein the dielectric layer has a first trench that exposes the bottom electrode; forming a variable resistance layer in the first trench; and irradiating the variable resistance layer with a laser, wherein the variable resistance layer is irradiated by the laser for a time of about 1.8 μs to about 54 μs.

A method of fabricating a variable resistance memory device, the method including: forming a plurality of first conductive lines on a substrate, wherein the plurality of first conductive lines extend in a first direction; forming a first interlayer dielectric layer on the first conductive lines; performing an etching process on a portion of the first interlayer dielectric layer to form a plurality of first trenches that expose the first conductive lines; forming a second interlayer dielectric layer and a plurality of bottom electrodes in the first trenches; performing an etching process on portions of the first and second interlayer dielectric layers to form a plurality of second trenches that expose the bottom electrodes; forming a variable resistance layer in the second trenches; irradiating the variable resistance layer with a laser; and forming a plurality of second conductive lines on the variable resistance layer, wherein the second conductive lines extend in a second direction intersecting the first direction, wherein the variable resistance layer is irradiated with the laser for a time of about 1.8 μs to about 54 μs.

DETAILED DESCRIPTION OF THE EMBODIMENTS

Figure 1:
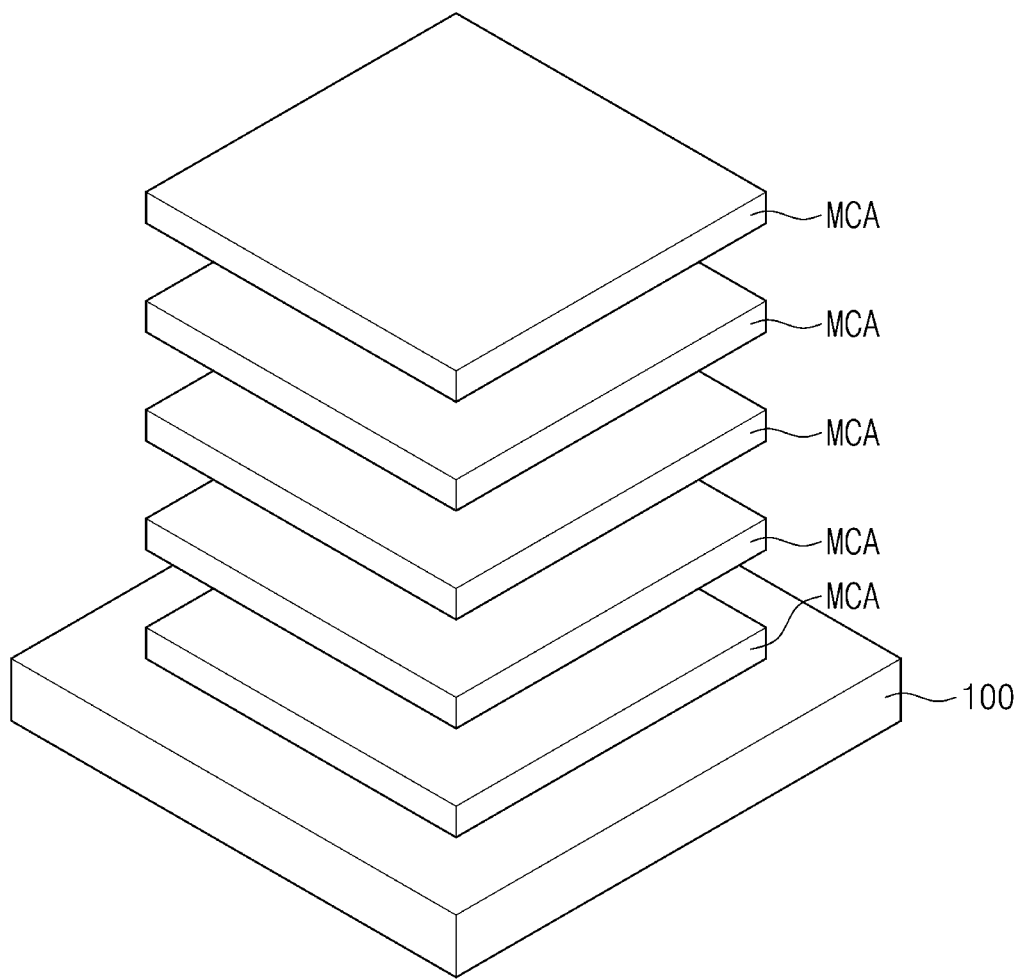
FIG. 1 illustrates a view showing a variable resistance memory device according to an exemplary embodiment of the present inventive concept.

FIG. 1 illustrates a conceptual view showing a variable resistance memory device according to an exemplary embodiment of the present inventive concept. Referring to FIG. 1, a variable resistance memory device according to an exemplary embodiment of the present inventive concept may include a plurality of memory cell stacks MCA that are sequentially stacked on a substrate 100. Each of the memory cell stacks MCA may include a plurality of variable resistance memory cells that are arranged two-dimensionally. The variable resistance memory device may include a plurality of conductive lines that are disposed to extend between the memory cell stacks MCA and to write, read, and erase the memory cells. FIG. 1 shows five memory cell stacks MCA, but the present inventive concept is not limited thereto.

FIGS. 2A, 2B, 2C, 2D and 2E illustrate perspective views showing a method of fabricating a variable resistance memory device according to an exemplary embodiment of the present inventive concept.

Figure 2A:
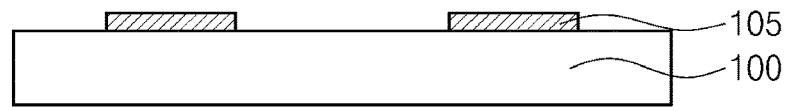
FIGS. 2A, 2B, 2C, 2D and 2E illustrate cross-sectional views showing a method of fabricating a variable resistance memory device according to an exemplary embodiment of the present inventive concept.

Referring to FIG. 2A, a substrate 100 may be provided. The substrate 100 may include, for example, a single-crystalline semiconductor material. For example, the substrate 100 may be a silicon substrate, a silicon-on-insulator (SOI) substrate, a germanium substrate, a germanium-on-insulator (GOI) substrate, and/or a silicon-germanium substrate.

A bottom electrode 105 may be formed on the substrate 100. For example, bottom electrode 105 may be a heater electrode that applies heat to a phase change material that is disposed thereon and changes a phase of the phase change material. For example, the bottom electrode 105 may include a conductive material having low activity with the phase change material, and the conductive material may include W, Ti, Al, Cu, C, CN, TiN, TiAlN, TiSiN, TiCN, WN, CoSiN, WSiN, TaN, TaCN, TaSiN, TiO, or a mixture thereof.

Figure 2B:
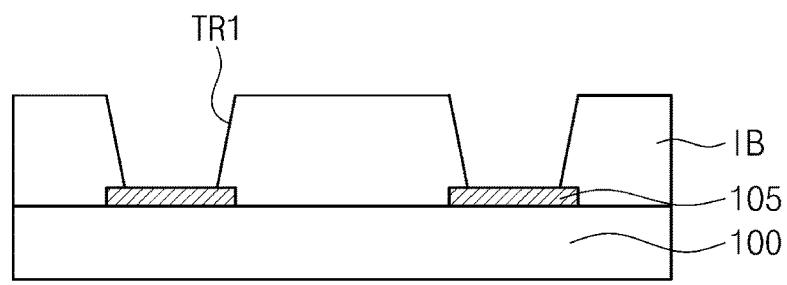

Referring to FIG. 2B, a dielectric layer IB having a first trench TR1 may be formed on the substrate 100 and a portion of the bottom electrode 105. For example, the dielectric layer IB may include silicon oxide, silicon nitride, silicon oxynitride, or a mixture thereof. For example, the first trench of the dielectric layer IB may expose a portion of the bottom electrode 105, while another portion of the bottom electrode 105 is covered by the dielectric layer IB.

Figure 2C:
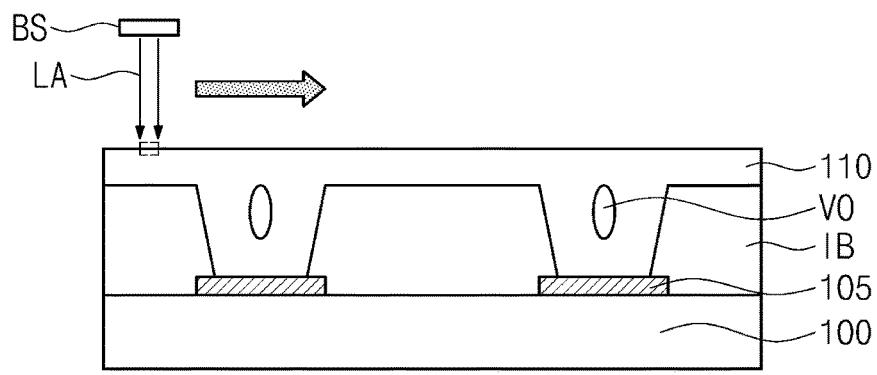

Referring to FIG. 2C, a variable resistance layer 110 may be formed to fill the first trench TR1. In the case where a phase change memory device is adopted as the variable resistance memory device according to an exemplary embodiment of the present inventive concept, the variable resistance layer 110 may include a material whose phase is reversibly changed between a crystalline state and an amorphous state based on temperature. For example, the variable resistance layer 110 may have a phase transition temperature between the crystalline state and the amorphous state of about 250° C. to 350° C. The phase change material may include a compound in which one or more of Te and Se as chalcogen elements are combined with one or more of Ge, Sb, Bi, Pb, Sn, Ag, As, S, Si, In, Ti, Ga, P, O, and C. Example compounds may include GeSbTe, GeTeAs, SbTeSe, GeTe, SbTe, SeTeSn, GeTeSe, SbSeBi, GeBiTe, GeTeTi, InSe, GaTeSe, InSbTe, or a mixture thereof.

Figure 2D:
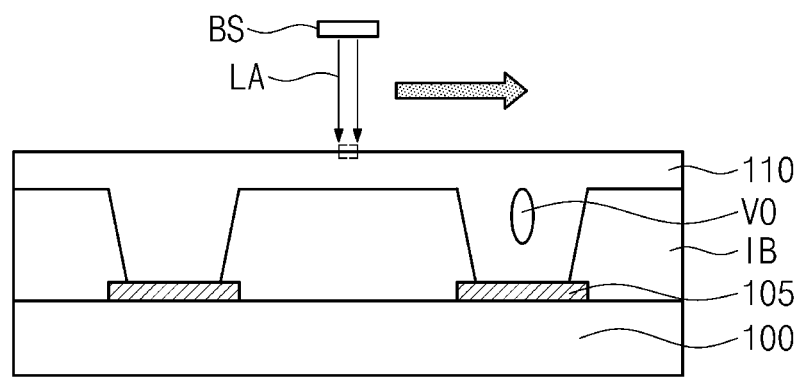
Figure 2E:
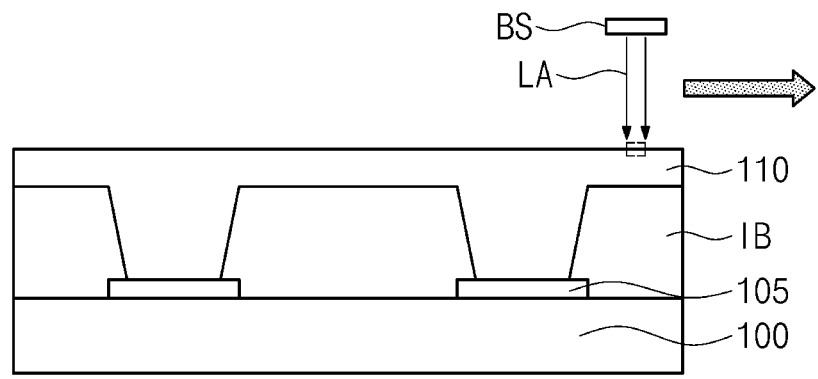

Referring to FIGS. 2C, 2D and 2E, the variable resistance layer 110 filling the first trench TR1 may be irradiated with a laser LA, through a beam slit BS, to reflow the variable resistance layer 110.

As shown in FIG. 2C, one or more voids VO (e.g., openings or holes) may be formed in the variable resistance layer 110. The voids VO may be removed by the laser LA emitted to the variable resistance layer 110. For example, the irradiation of the laser LA to the variable resistance layer 110 may cause the variable resistance layer 110 to melt at a temperature greater than a melting point of the variable resistance layer 110, and thus the voids VO may be removed. As shown in FIGS. 2C, 2D and 2E, the voids VO may be formed to have closed shapes that are hermetically sealed in the variable resistance layer 110. In an exemplary embodiment of the present inventive concept, the void VO may be formed in an upper portion of the variable resistance layer 110, and a portion of the void VO may be externally open. For example, the void VO may be similar to an indentation at the upper surface of the variable resistance layer 110.

The variable resistance layer 110 may be irradiated with the laser LA for a time of about 1.84 µs to about 54 µs, for example, about 1.8 µs to about 18 µs. When the laser irradiation time (or, e.g., a dwell time) satisfies the aforementioned range, the void VO may be effectively removed from the variable resistance layer 110. When the dwell time is less than about 1.8 µs, fine-sized voids VO may not be completely removed from the variable resistance layer 110, and ablation may be created on a surface of the variable resistance layer 110.

The laser LA may be a solid laser that uses a solid material as a laser medium, for example, an yttrium-aluminum-garnet (YAG) laser. In an exemplary embodiment of the present inventive concept, to adjust a wavelength of the laser LA, a YAG laser, whose laser medium is doped with neodymium (Nd) or ytterbium (Yb), may be used.

The laser LA may have a wavelength of about 250 nm to 1,000 nm. The wavelength of the laser LA may be adjusted by concentration of, for example, neodymium (Nd) or ytterbium (Yb) discussed above. When the wavelength of the laser LA is less than about 250 nm, the laser LA may have an extremely high intensity to damage the surface of the variable resistance layer 110, and when the wavelength of the laser LA is greater than about 1,000 nm, the intensity of the laser LA may be so low that the variable resistance layer 110 cannot be effectively melted by the laser LA.

The laser LA may have an energy density of about 0.1 $J/cm^2$ to about 4 $J/cm^2$. The energy density of the laser LA may be adjusted by the dwell time of the laser LA and a composition of the variable resistance layer 110. When the energy density of the laser LA satisfies the aforementioned range, the void VO may be effectively removed from the variable resistance layer 110.

In an exemplary embodiment of the present inventive concept, the laser LA may have a frequency of about 5 Hz to about 10,000 Hz, and may have a peak power of about 0.1 kW to about 4,000 kW. The irradiation of the laser LA to the variable resistance layer 110 may be performed at a temperature ranging from about room temperature (e.g., about 20° C.) to about 400° C.

Figure 3:
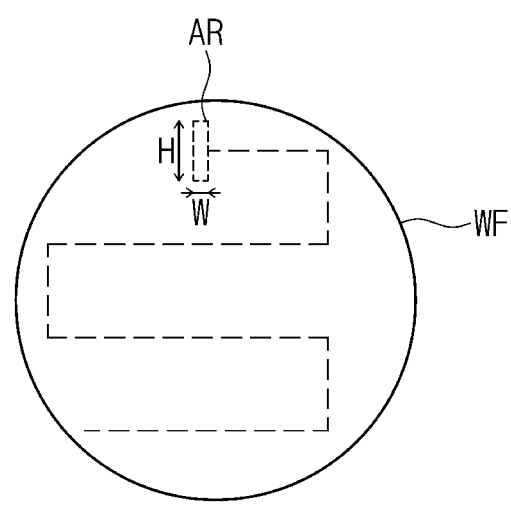
FIG. 3 illustrates a view showing a laser irradiation step according to an exemplary embodiment of the present inventive concept.

FIG. 3 illustrates a view showing a laser irradiation step according to an exemplary embodiment of the present inventive concept.

Referring to FIG. 3, the laser LA may be emitted to a wafer WF on which the variable resistance layer 110 is formed. The laser LA may be emitted through a beam slit BS, and a scan method may be employed in which the laser LA is emitted while scanning along one direction. A radiation span AR (e.g., a size of the laser beam) of the laser LA radiated to the variable resistance layer 110 irradiated by the laser LA may have a width W of about 30 µm to about 20,000 µm and a length H of about 2,400 µm to about 20,000 µm.

The laser LA may move at a scan speed of about 5 mm/s to about 300 mm/s. When the scan speed of the laser LA satisfies the aforementioned range, the variable resistance layer 110 may be supplied with heat in a substantially uniform manner.

The step of irradiating the laser LA may be performed under an inert gas environment. For example, the step of irradiating the laser LA may be performed under an environment including an inert gas, such as helium (He), neon (Ne), argon (Ar), krypton (Kr), and/or nitrogen ($N_2$). The step of irradiating the laser LA may be performed under an inert gas environment at a pressure of about 1 Torr to about 10 Torr.

In the method of fabricating a variable resistance memory device according to an exemplary embodiment of the present inventive concept, a variable resistance layer may be irradiated with a laser for a certain time, and as a result, voids may be removed from the variable resistance layer. For example, it may be possible to remove fine-sized voids from the variable resistance layer formed in a trench, of a dielectric layer, that has a large aspect ratio (e.g., about 5.0 or higher).

Figure 4:
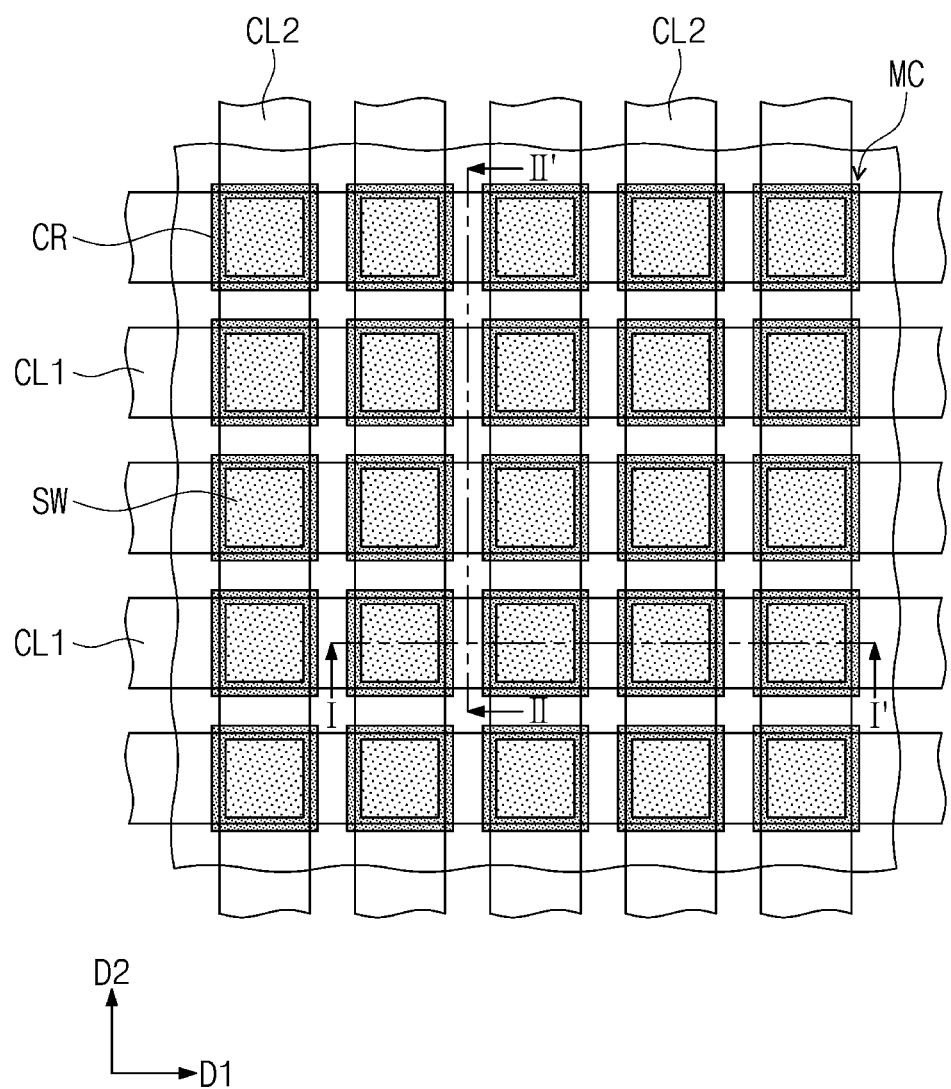
FIG. 4 illustrates a plan view showing a variable resistance memory device according to an exemplary embodiment of the present inventive concept.

FIG. 4 illustrates a plan view showing a variable resistance memory device according to an exemplary embodiment of the present inventive concept. Referring to FIG. 4, one or more memory cell stacks may be provided on a substrate. For example, the memory cell stack may be one of the memory cell stacks MCA discussed above with reference to FIG. 1. The memory cell stacks may be disposed between first conductive lines CL1 and second conductive lines CL2 that are sequentially provided on the substrate. The first conductive lines CL1 may extend along a first direction D1 substantially parallel to a top surface of the substrate, and the second conductive lines CL2 may extend in a second direction D2 that intersects the first direction D1 and is substantially parallel to the top surface of the substrate. The first and second conductive lines CL1 and CL2 may include a conductive material, such as copper and/or aluminum. The first and second conductive lines CL1 and CL2 may further include conductive metal nitride, such as TiN and/or WN.

Memory cells MC may be disposed at intersections between the first conductive lines CL1 and the second conductive lines CL2. Each of the memory cells MC may include a variable resistance structure CR and a switching element SW. The variable resistance structure CR may be provided between the switching element SW and the substrate. In addition, the switching element SW may be provided between the variable resistance structure CR and the substrate. For brevity of description, it will be hereinafter described the case where the variable resistance structure CR is provided between the first conductive line CL1 and the switching element SW, but the present inventive concept is not limited thereto.

FIGS. 5, 6, 7, 8, 9, 10 and 11 illustrate cross-sectional views taken along lines I-I' and II-II' of FIG. 4, showing a method of fabricating a variable resistance memory device according to an exemplary embodiment of the present inventive concept. Any descriptions substantially the same as those discussed above with reference to FIGS. 2A to 2E, 3, and 4 may be omitted for brevity of explanation.

Figure 5:
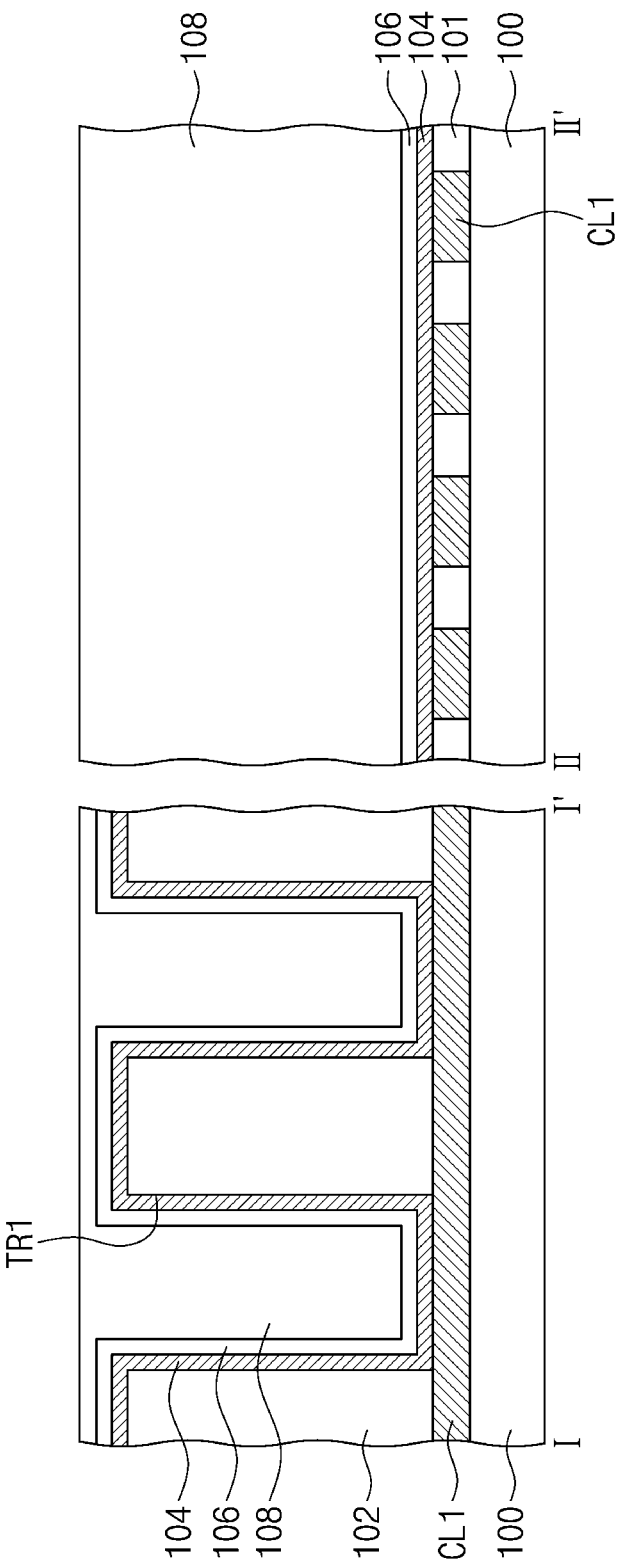
FIGS. 5, 6, 7, 8, 9, 10 and 11 illustrate cross-sectional views taken along lines I-I' and II-II' of FIG. 4, showing a method of fabricating a variable resistance memory device according to an exemplary embodiment of the present inventive concept.

Referring to FIGS. 4 and 5, first conductive lines CL1 may be provided on a substrate 100. The first conductive lines CL1 may be provided in a first dielectric layer 101. A first interlayer dielectric layer 102 may be formed on the first conductive lines CL1, and then first trenches TR1 may be formed in the first interlayer dielectric layer 102. The formation of the first trenches TR1 may include performing an anisotropic etch process on the first interlayer dielectric layer 102. The first trenches TR1 may intersect the first conductive line CL1. The first dielectric layer 101 may include, for example, silicon nitride or silicon oxynitride.

An electrode layer 104 and a spacer layer 106 may be sequentially formed on the first interlayer dielectric layer 102 in which the first trenches TR1 are formed. The electrode layer 104 and the spacer layer 106 may be conformally formed along shapes of the first trenches TR1. For example, the electrode layer 104 and the spacer layer 106 may be formed in the first trench TR1. The electrode layer 104 may include, for example, W, Ti, Al, Cu, C, CN, TiN, TiAlN, TiSiN, TiCN, WN, CoSiN, WSiN, TaN, TaCN, TaSiN, TiO, or a mixture thereof. The spacer layer 106 may include, for example, silicon oxide, silicon oxynitride, or a mixture thereof. A second interlayer dielectric layer 108 may be formed on the spacer layer 106, thereby filling the first trenches TR1. The second interlayer dielectric layer 108 may include substantially the same material as that of the first interlayer dielectric layer 102.

Figure 6:
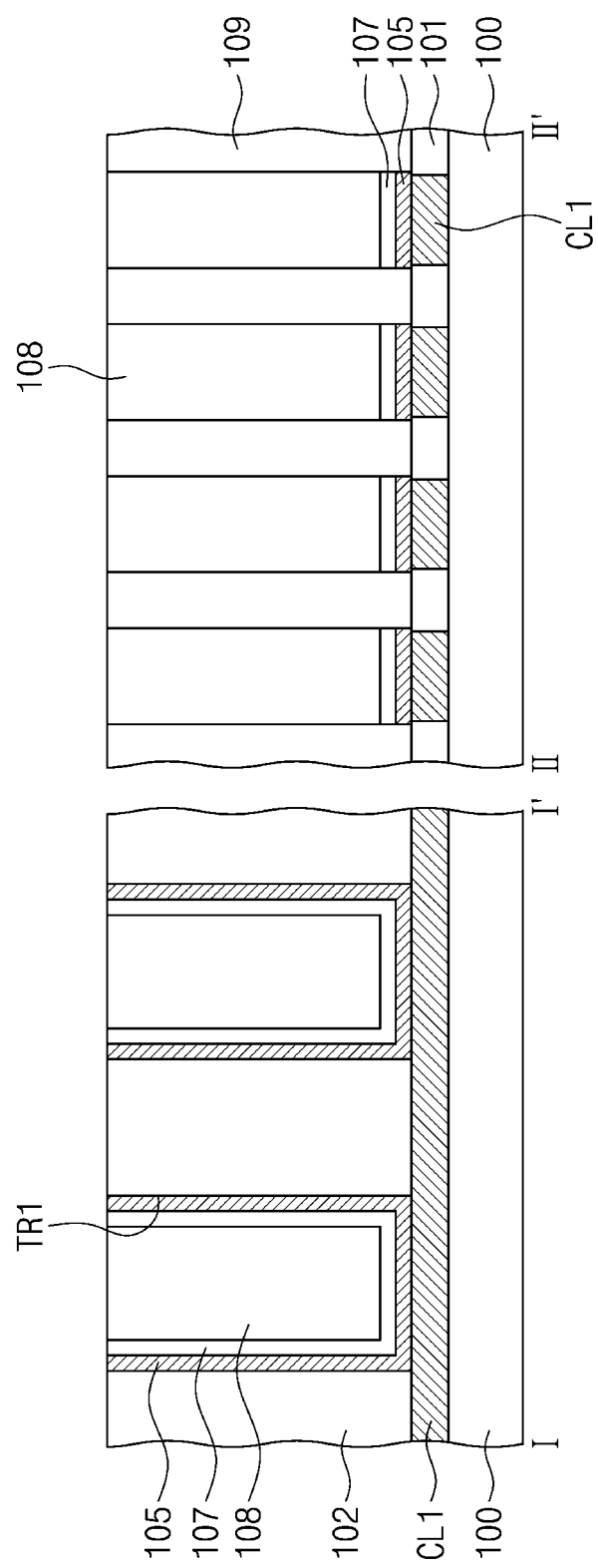

Referring to FIGS. 4 and 6, a planarization process may be performed until the first interlayer dielectric layer 102 is exposed. For example, portions of the electrode layer 104 and spacer layer 106 may be removed to expose the first interlayer dielectric layer 102. Afterwards, the second interlayer dielectric layer 108, the spacer layer 106, and the electrode layer 104 may be sequentially etched to form opening regions between the first conductive lines CL1 in the second direction D2. As a result, bottom electrodes 105 may be formed from the electrode layer 104, and spacer patterns 107 may be formed from the spacer layer 106. The bottom electrodes 105 may be spaced apart from each other in the first direction D1 and the second direction D2, and the same configuration may be true for the spacer patterns 107. For example, the bottom electrodes 105 and the spacer patterns 107 may be formed in the first trench TR1 and may overlap the first conductive lines CL1. Thereafter, a third interlayer dielectric layer 109 may be formed to fill the opening regions. The formation of the third interlayer dielectric layer 109 may include performing a planarization process. The third interlayer dielectric layer 109 may include substantially the same material as that of the first interlayer dielectric layer 102.

Figure 7:
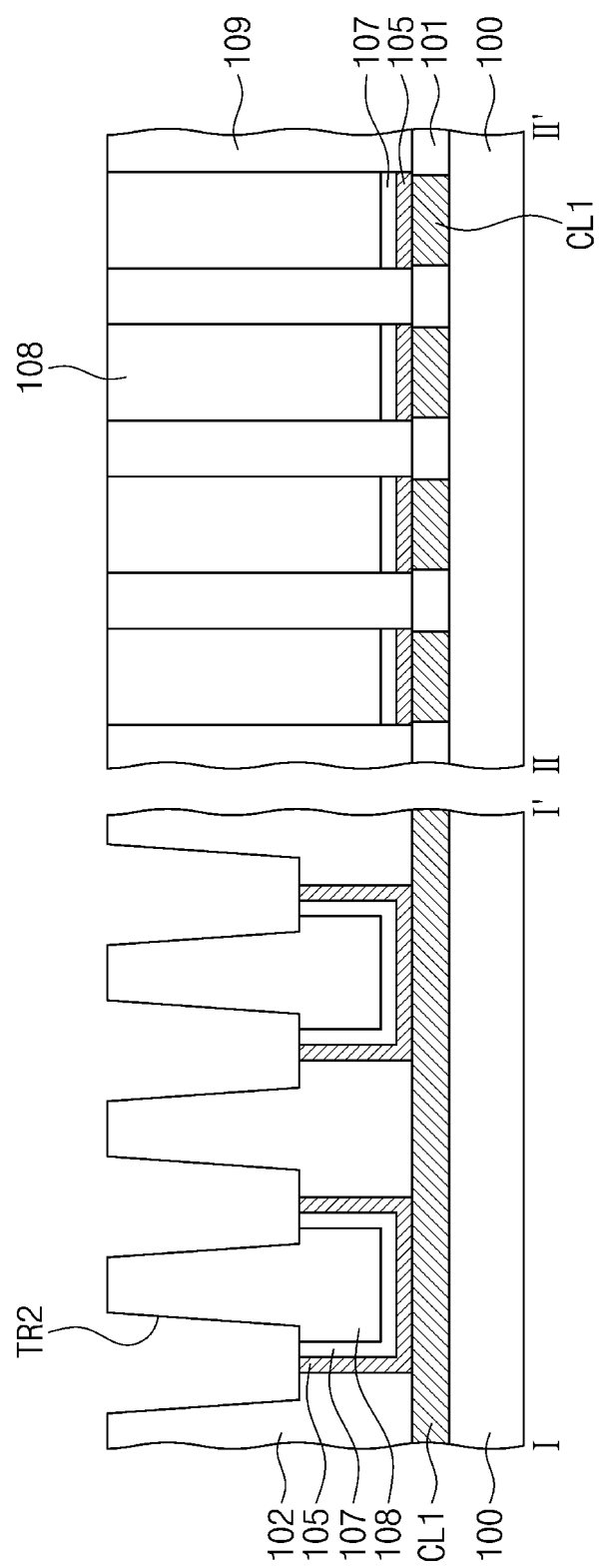

Referring to FIGS. 4 and 7, second trenches TR2 may be formed to expose upper portions of the bottom electrodes 105. The formation of the second trenches TR2 may include etching upper portions of the first interlayer dielectric layer 102, the second interlayer dielectric layer 108, the spacer patterns 107, and the bottom electrodes 105. A wet etching process may be performed to etch the upper portions of the first interlayer dielectric layer 102, the second interlayer dielectric layer 108, the spacer patterns 107, and the bottom electrodes 105. Thereafter, an isotropic etching process may be performed to expand empty spaces that are formed by removal of the upper portions of the first interlayer dielectric layer 102, the second interlayer dielectric layer 108, the spacer patterns 107, and the bottom electrodes 105. For example, the isotropic etching process may be executed by using an etchant that includes phosphoric acid.

Figure 8:
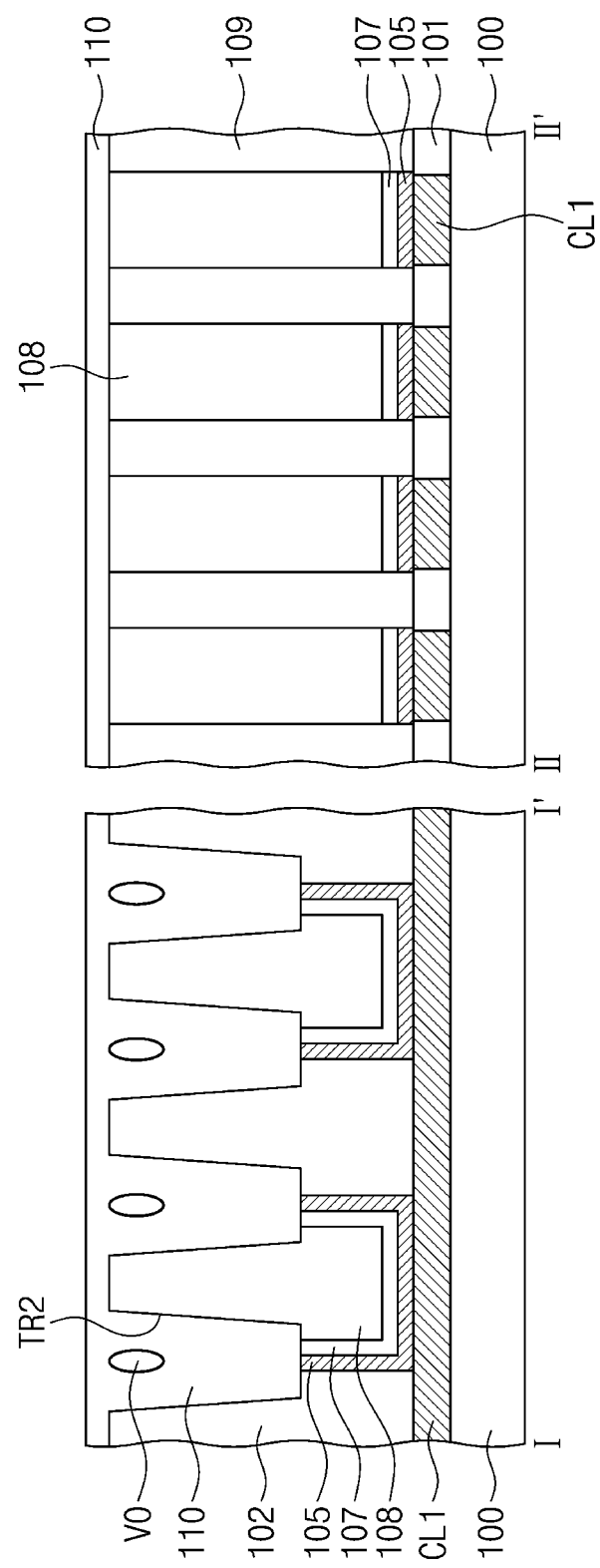

Referring to FIGS. 4 and 8, a variable resistance layer 110 may be formed to fill the second trenches TR2. The variable resistance layer 110 may be formed by physical vapor deposition or chemical vapor deposition. One or more voids VO may be formed in the variable resistance layer 110, and the variable resistance layer 110 may be irradiated with a laser LA to remove the voids VO. The step of irradiating the variable resistance layer 110 with the laser LA may be substantially the same as the laser irradiation process discussed above with reference to FIGS. 2A to 2E and 3.

Figure 9:
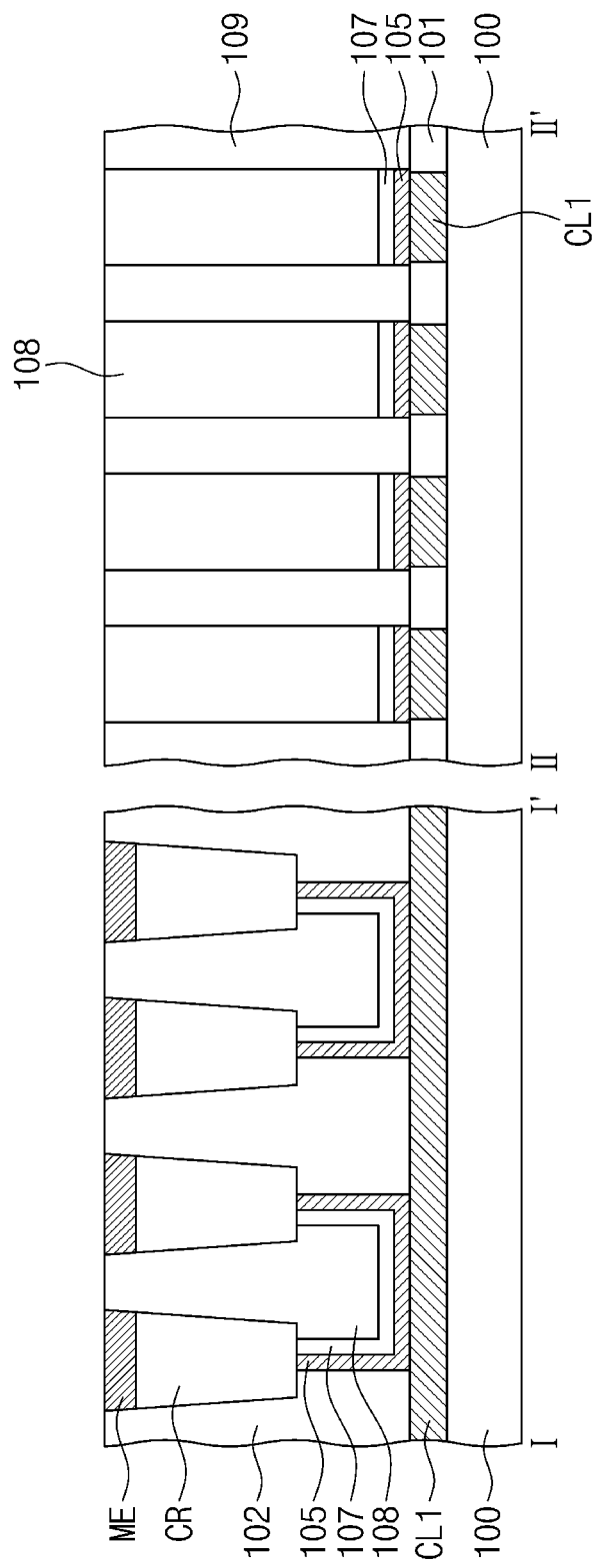

Referring to FIGS. 4 and 9, an upper portion of the variable resistance layer 110 may be etched to form variable resistance structures CR in the second trenches TR2. Middle electrodes ME may be formed on upper portions of the variable resistance structures CR. The middle electrodes ME may be formed by forming an electrode layer on a resultant structure formed from the variable resistance structures CR, and then performing a planarization process on the electrode layer. The middle electrodes ME may electrically connect the variable resistance structures CR to switching elements (see switching elements SW of FIG. 10), and may prevent direct contact between the variable resistance structures CR and the switching elements. The middle electrodes ME may include, for example, W, Ti, Al, Cu, C, CN, TiN, TiAlN, TiSiN, TiCN, WN, CoSiN, WSiN, TaN, TaCN, TaSiN, or a mixture thereof.

Figure 10:
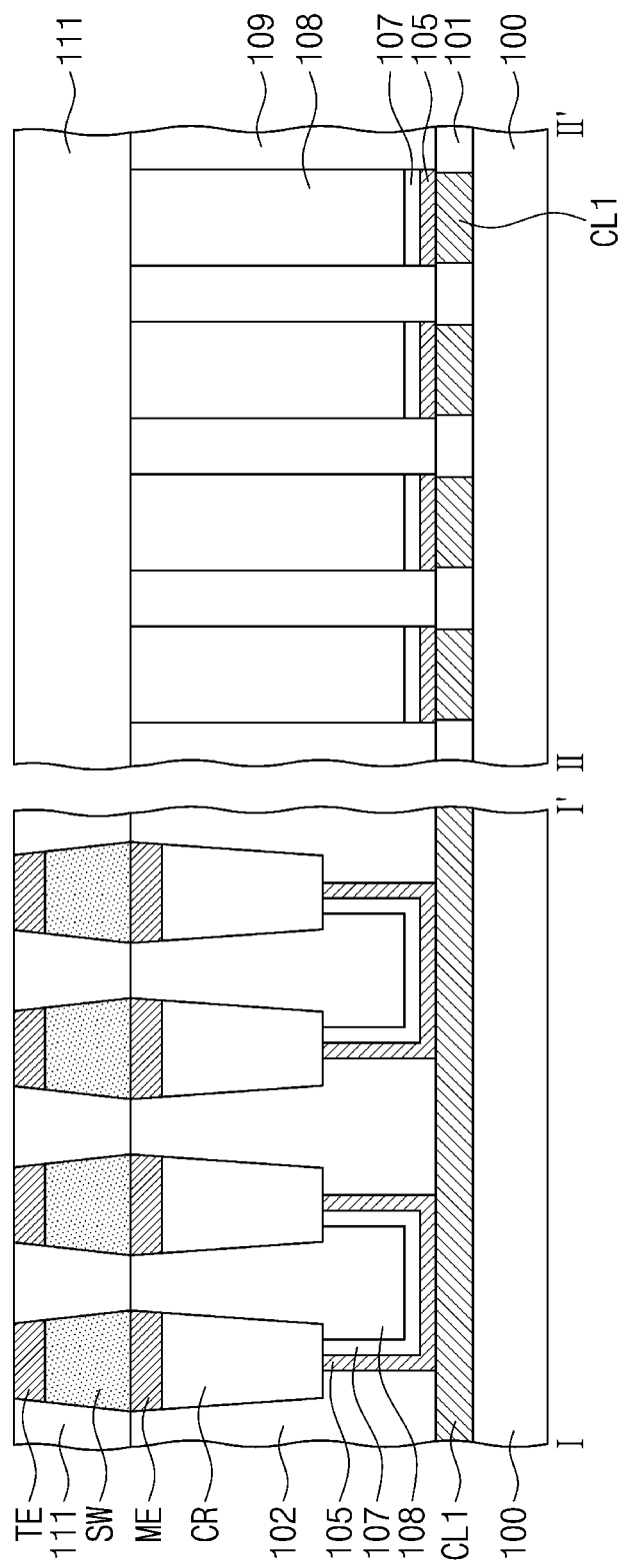

Referring to FIGS. 4 and 10, a second dielectric layer 111 may be formed on the first, second, and third interlayer dielectric layers 102, 108, and 109. The second dielectric layer 111 may include holes that expose top surfaces of the middle electrodes ME. The second dielectric layer 111 may include, for example, silicon nitride.

Switching elements SW and top electrodes TE may be sequentially formed in the holes. The switching elements SW may fill lower portions of the holes formed in the second dielectric layer 111, and the top electrodes TE may be formed on the switching elements SW. For example, the top electrodes TE may be formed on top surfaces of the switching elements SW and may fill upper portions of the holes. The switching element SW may have a phase transition temperature between crystalline and amorphous states that is greater than that of the variable resistance structure CR. For example, the switching element SW may have a phase transition temperature of about 350° C. to about 450° C. Therefore, when operating a variable resistance memory device according to an exemplary embodiment of the present inventive concept, the variable resistance structures CR may be reversibly changed between their crystalline and amorphous states under an operating voltage, while the switching elements SW may maintain their substantially amorphous state without the phase transition under the operating voltage. In this description, the phrase "substantially amorphous state" may not exclude the presence of a locally crystalline grain boundary or a locally crystalline portion in an object. The switching elements SW may include a compound in which one or more of, for example, Te and/or Se as chalcogen elements are combined with one or more of, for example, Ge, Sb, Bi, Al, Pb, Sn, Ag, As, S, Si, In, Ti, Ga, and/or P. The switching elements SW may further include a thermal stabilization element in addition to the compound. The thermal stabilization element may be one or more of C, N, and/or O. For example, the switching elements SW may include, for example, AsTe, AsSe, GeTe, SnTe, GeSe, SnTe, SnSe, ZnTe, AsTeSe, AsTeGe, AsSeGe, AsTeGeSe, AsSeGeSi, AsSeGeC, AsTeGeSi, AsTeGeS, AsTeGeSiIn, AsTeGeSiP, AsTeGeSiSbS, AsTeGeSiSbP, AsTeGeSeSb, AsTeGeSeSi, AsTeGeSiSeNS, SeTeGeSi, GeSbTeSe, GeBiTeSe, GeAsSbSe, GeAsBiTe, GeAsBiSe, or a mixture thereof. The top electrodes TE may include, for example, W, Ti, Al, Cu, C, CN, TiN, TiAlN, TiSiN, TiCN, WN, CoSiN, WSiN, TaN, TaCN, TaSiN, TiO, or a mixture thereof.

Figure 11:
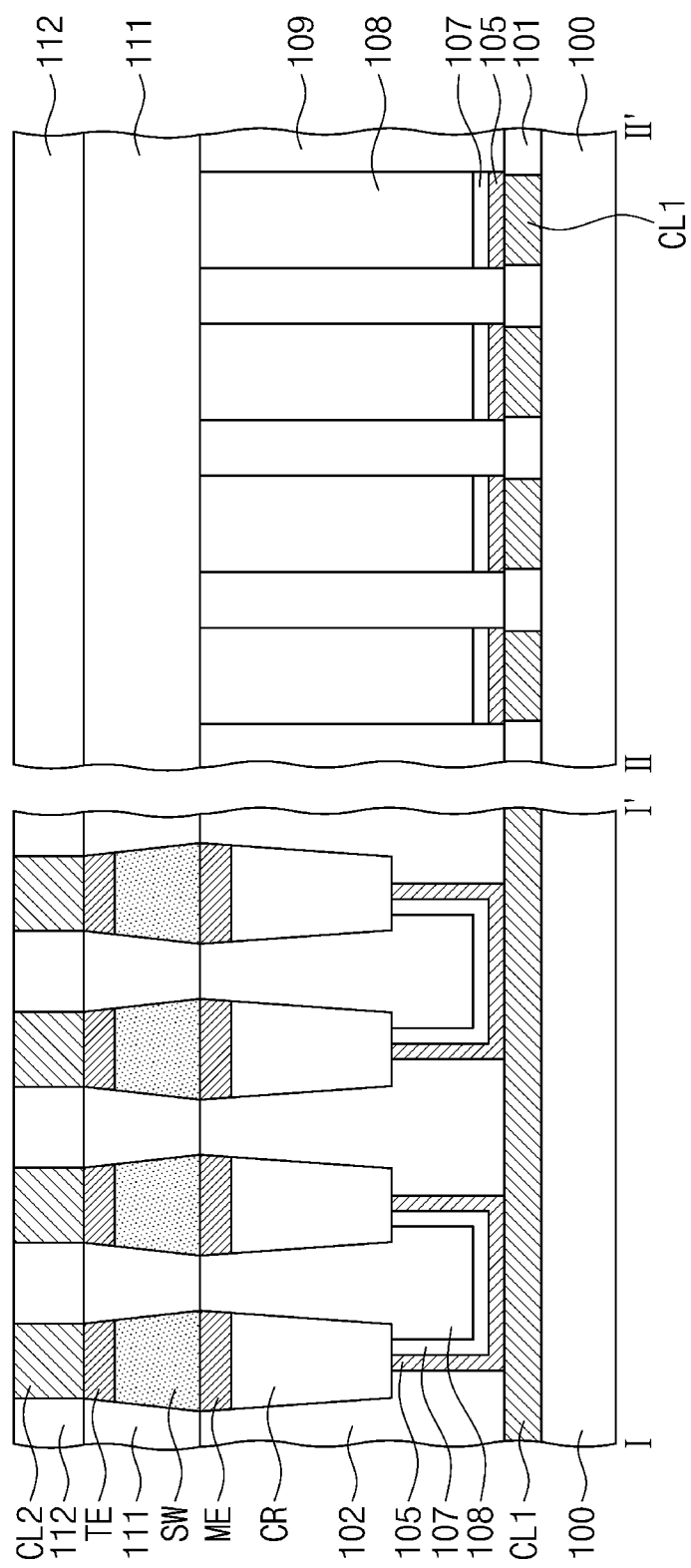

Referring to FIGS. 4 and 11, second conductive lines CL2 may be formed on the top electrodes TE. The formation of the second conductive lines CL2 may include forming a conductive layer on the top electrodes TE and then patterning the conductive layer. Afterwards, a third dielectric layer 112 may be formed to fill spaces between the second conductive lines CL2. For example, the third dielectric layer 112 may include silicon oxide, silicon oxynitride, or a mixture thereof.

Figure 12A:
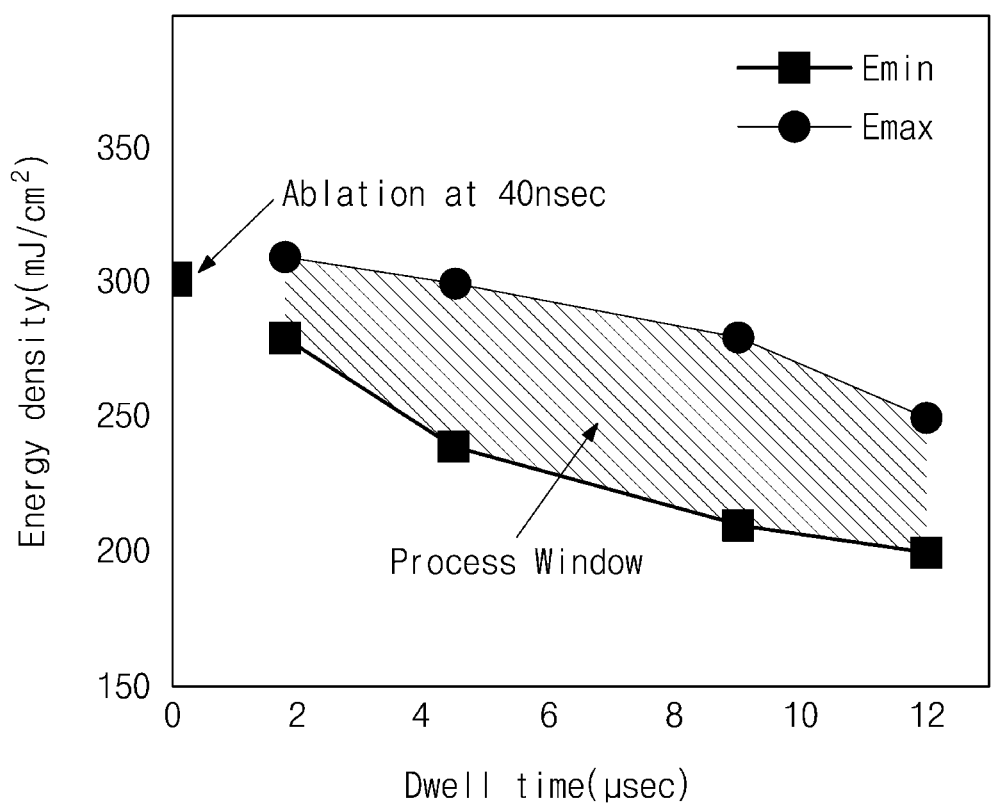
FIGS. 12A and 12B illustrate graphs showing formation of a process window versus a laser irradiation time.
Figure 12B:
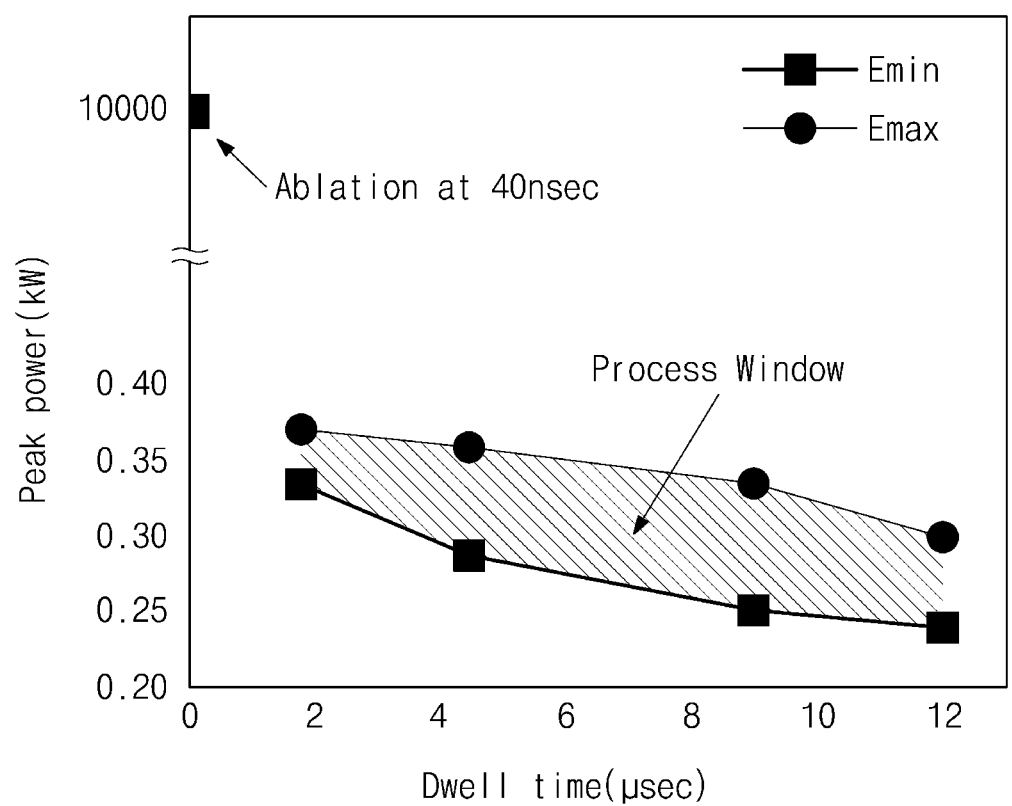

FIGS. 12A and 12B illustrate graphs showing formation of a process window versus a laser irradiation time.

As shown in FIGS. 12A and 12B, when the variable resistance layer 110 is irradiated by the laser LA for a time (or, for example, a dwell time) less than about 1.8 μs, no process window may be formed. In addition, when the variable resistance layer 110 is irradiated by the laser LA for an extremely short time (e.g., about 40 ns), ablation may be created on a surface of the variable resistance layer 110. In addition, when the variable resistance layer 110 is irradiated by the laser LA for a time of about 1.8 μs to about 12 μs, a wide process window may be obtained.

Figure 13:
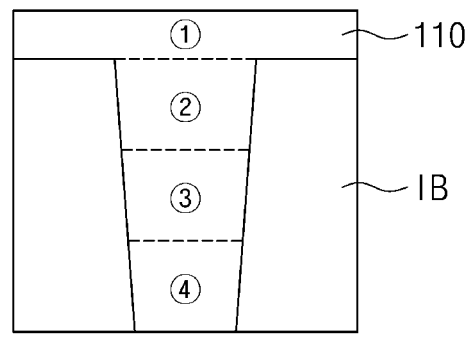
FIG. 13 illustrates a cross-sectional view showing a variable resistance layer formed on a dielectric layer according to an exemplary embodiment of the present inventive concept.

FIG. 13 illustrates a cross-sectional view showing a variable resistance layer formed on a dielectric layer according to an exemplary embodiment of the present inventive concept.

As shown in FIG. 13, a dielectric layer IB may be formed, and then the dielectric layer IB may be partially removed to form a trench. Thereafter, GeSbTe may be used for a sputtering process to form the variable resistance layer 110 in the trench of the dielectric layer IB. The variable resistance layer 110 may be divided into regions ①, ②, ③, and ④, based on its height, and composition ratios of Ge included in the regions ①, ②, ③, and ④ may be measured in the case where an annealing process is performed and in the case where a laser is radiated (e.g., for a time of 12 about μs).

In the case where the annealing process is performed on the variable resistance layer 110 (e.g., at a process temperature of about 355° C.), it may be ascertained that the regions ①, ②, ③, and ④ may respectively have irregular Ge composition ratios of about 20 percentage by weight (wt %), about 13 wt %, about 10 wt %, and about 10 wt %. In addition, in the case where the laser is emitted to the variable resistance layer 110, it may be ascertained that the regions ①, ②, ③, and ④ may respectively have Ge composition ratios of 19 wt %, 19 wt %, 21 wt %, and 22 wt %, in which Ge composition ratios are more regular than those in the case where the annealing process is performed.

Figure 14:
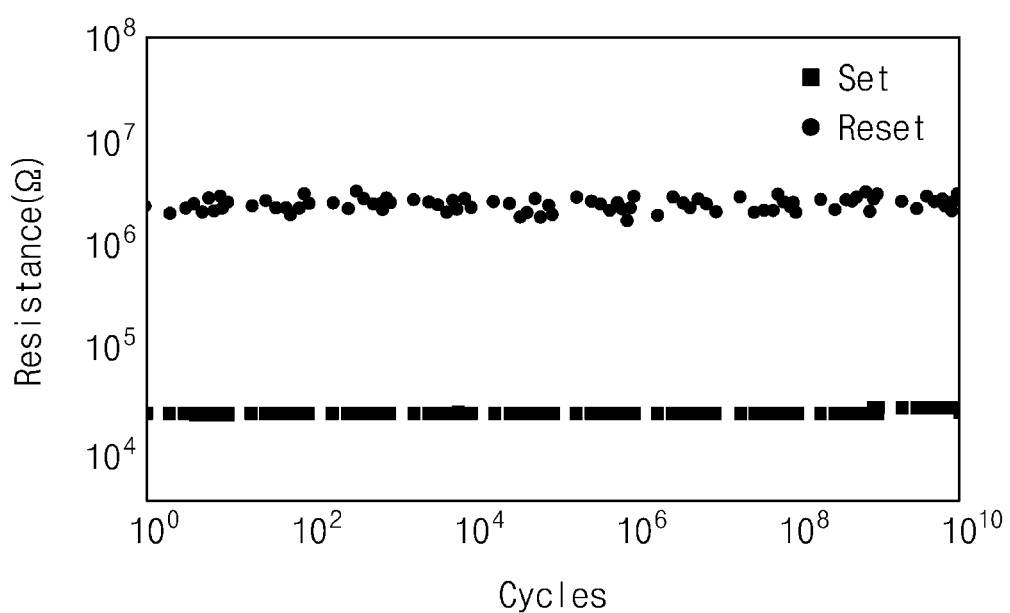
FIG. 14 illustrates a graph showing program/erase cycle endurance of a variable resistance memory device according to an exemplary embodiment of the present inventive concept.

FIG. 14 illustrates a graph showing program/erase cycle endurance of a variable resistance memory device according to an exemplary embodiment of the present inventive concept.

As shown in FIG. 14, a variable resistance memory device fabricated by a process according to an exemplary embodiment of the present inventive concept may normally operate to have a high program/erase cycle endurance even when a voltage is repeatedly applied 1010 times.

A method of fabricating a variable resistance memory device according to an exemplary embodiment of the present inventive concept may include a step of irradiating a variable resistance layer with a laser, and thus it is possible to easily remove voids capable of being formed in the variable resistance layer. For example, voids may be completely removed in fabricating a variable resistance memory device having a large aspect ratio.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A method of fabricating a variable resistance memory device, the method comprising:
   forming a bottom electrode on a substrate;
   forming a dielectric layer on the substrate, wherein the dielectric layer has a first trench that exposes the bottom electrode;
   forming a variable resistance layer in the first trench; and
   irradiating the variable resistance layer with a laser,
   wherein the variable resistance layer is irradiated by the laser for a time of about 1.8 μs to about 54 μs.

2. The method of claim 1, wherein the variable resistance layer has a void,
   wherein the void is removed when the variable resistance layer is irradiated by the laser.

3. The method of claim 1, wherein the variable resistance layer includes a phase change material.

4. The method of claim 3, wherein the phase change material includes a compound including of Te or Se combined with Ge, Sb, Bi, Pb, Sn, Ag, As, S, Si, In, Ti, Ga, P, O, or C.

5. The method of claim 1, wherein the variable resistance layer is irradiated by the laser for a time of about 1.8 μs to about 18 μs.

6. The method of claim 1, wherein the laser is a solid laser.

7. The method of claim 6, Wherein the solid laser is an yttrium-aluminum-garnet (YAG) laser.

8. The method of claim 1, wherein an energy density of the laser is about 0.1 J/cm$^2$ to about 4 J/cm$^2$.

9. The method of claim 1, wherein a wavelength of the laser is about 250 nm to about 1000 nm.

10. The method of claim 1, wherein a frequency of the laser is about 5 Hz to about 10,000 Hz.

11. The method of claim 1, wherein a power of the laser is about 0.1 kW to about 4,000 kW.

12. The method of claim 1, wherein the laser radiated to the variable resistance layer has a radiation span having a width of about 30 μm to about 20,000 μm and a length of about 2,400 μm to about 20,000 μm.

13. The method of claim 1, wherein a scan speed of the laser is about 5 mm/s to about 300 mm/s.

14. The method of claim 1, wherein irradiating the variable resistance layer with the laser is performed under an inert gas environment at a pressure of about 1 Torr to about 10 Torr.

15. A method of fabricating a variable resistance memory device, the method comprising:
    forming a plurality of first conductive lines on a substrate, wherein the plurality of first conductive lines extend in a first direction;
    forming a first interlayer dielectric layer on the first conductive lines;
    performing an etching process on a portion of the first interlayer dielectric layer to form a plurality of first trenches that expose the first conductive lines;
    forming a second interlayer dielectric layer and a plurality of bottom electrodes in the first trenches;
    performing an etching process on portions of the first and second interlayer dielectric layers to form a plurality of second trenches that expose the bottom electrodes;
    forming a variable resistance layer in the second trenches;
    irradiating the variable resistance layer with a laser; and
    forming a plurality of second conductive lines on the variable resistance layer, wherein the second conductive lines extend in a second direction intersecting the first direction,
    wherein the variable resistance layer is irradiated with the laser for a time of about 1.8 μs to about 54 μs.

16. The method of claim 15, wherein the variable resistance layer is irradiated by the laser for a time of about 1.8 μs to about 18 μs.

17. The method of claim 15, wherein an energy density of the laser is about 0.1 J/cm$^2$ to about 4 J/cm$^2$.

18. The method of claim 15, wherein a wavelength of the laser is about 250 nm to about 1,000 nm.

19. The method of claim 15, wherein the laser radiated to the variable resistance layer has a radiation span having a width of about 30 μm to about 20,000 μm and a length of about 2,400 μm to about 20,000 μm.

20. The method of claim 15, wherein a scan speed of the laser is about 5 mm/s to about 300 mm/s.

21. The method of claim 15, wherein each of the plurality of second trenches partially overlaps a corresponding first trench of the plurality of first trenches.

\* \* \* \* \*